(12) United States Patent
Sadoughi

(10) Patent No.: US 8,183,105 B2
(45) Date of Patent: May 22, 2012

(54) INTEGRATED CIRCUIT DEVICE WITH STRESS REDUCTION LAYER

(75) Inventor: Sharmin Sadoughi, Menlo Park, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 13/228,884

(22) Filed: Sep. 9, 2011

(65) Prior Publication Data

US 2012/0007188 A1   Jan. 12, 2012

Related U.S. Application Data

(62) Division of application No. 12/420,672, filed on Apr. 8, 2009, now Pat. No. 8,035,166.

(51) Int. Cl.
*H01L 21/8238* (2006.01)

(52) U.S. Cl. . 438/199; 438/769; 257/369; 257/E21.632; 257/E27.06

(58) Field of Classification Search .......... 438/197, 438/199, 301, 757, 769, 954; 257/369, 390, 257/392, 393, 632, 635, 639, E27.06, E27.062, 257/E21.632
See application file for complete search history.

(56) References Cited

U.S. PATENT DOCUMENTS

| | | | |
|---|---|---|---|
| 7,214,629 | B1 | 5/2007 | Luo et al. |
| 7,834,399 | B2 | 11/2010 | Kanarsky et al. |
| 2007/0040199 | A1 | 2/2007 | Kotani |
| 2007/0262385 | A1 | 11/2007 | Nguyen et al. |
| 2008/0003734 | A1 | 1/2008 | Chuang et al. |
| 2008/0099786 | A1* | 5/2008 | Maeda et al. ............. 257/190 |
| 2008/0191284 | A1 | 8/2008 | Baiocco et al. |
| 2009/0026548 | A1 | 1/2009 | Song et al. |
| 2009/0057809 | A1 | 3/2009 | Richter et al. |
| 2009/0079023 | A1 | 3/2009 | Berthold et al. |

OTHER PUBLICATIONS

U.S. Appl. No. 12/420,672, filed Apr. 8, 2009, Sadoughi.
Ahmad, W.R.W et al., "TCAD Simulation of Local Mechanical Stress Reduction by Use of a Compressive Silicon Nitride/Silicon Oxynitride Etch Stop Bi-Layer for CMOS Performance Enhancement," *Proc. of the 31st International Conference on Electronics Manufacturing & Technology*, Nov. 8-10, 2006, pp. 411-415, IEEE, Piscataway, New Jersey, USA.
Chen, X. et al., "Stress Proximity Technique for Performance Improvement with Dual Stress Liner at 45nm Technology and Beyond," *2006 Symposium on VLSI Technology Digest of Technical Papers*, Jun. 13-15, 2006, pp. 60-61, IEEE, Piscataway, New Jersey, USA.
Gehres, R. et al., "High Volume Manufacturing Ramp in 90nm Dual Stress Liner Technology," *Proc. of the 17th Annual SEMI/IEEE Advanced Semiconductor Manufacturing Conference*, May 22-24, 2006, pp. 411-416, IEEE, Piscataway, New Jersey, USA.

* cited by examiner

*Primary Examiner* — Hoai V Pham
(74) *Attorney, Agent, or Firm* — Kenneth Glass; Thomas George

(57) ABSTRACT

An integrated circuit device is disclosed that includes a dual stress liner NMOS device having a tensile stress layer that overlies a NMOS gate film stack, a dual stress liner PMOS device having a compressive stress layer that overlies a PMOS gate film stack, a reduced-stress dual stress liner NMOS device having a stress reduction layer that extends between the tensile stress layer and the NMOS gate film stack, and a reduced-stress dual stress liner PMOS device having a stress reduction layer that extends between the compressive stress layer and the PMOS gate film stack. In embodiments of the invention additional reduced-stress dual stress liner NMOS devices and reduced-stress PMOS devices are formed by altering the thickness and/or the material properties of the stress reduction layer.

20 Claims, 12 Drawing Sheets

US 8,183,105 B2

INTEGRATED CIRCUIT DEVICE WITH STRESS REDUCTION LAYER

CROSS-REFERENCE TO RELATED APPLICATIONS

This application is a divisional of U.S. patent application having the application Ser. No. 12/420,672, filed on Apr. 8, 2009, entitled "INTEGRATED CIRCUIT DEVICE WITH STRESS REDUCTION LAYER" by Sharmin Sadoughi.

FIELD OF THE INVENTION

An embodiment of the invention relates to semiconductor devices ("ICs"). More particularly, an embodiment of the invention relates to fine tuning charge mobility in semiconductors by fine tuning mechanical stress.

BACKGROUND

Conventional integrated circuit device manufacturing processes for 90 nanometer and smaller devices rely on stress engineering to meet the power and performance requirements of high end devices. In single stress liner processes, stress is only provided to N-Channel Metal Oxide Semiconductor (NMOS) devices. The stress can be provided, for example, by a tensile stress layer that overlies the source, drain and gate of the NMOS device.

In other processes stress is provided to both NMOS devices and P-Channel Metal Oxide Semiconductor (PMOS) devices. One process for providing stress to both NMOS and PMOS devices is the Dual Stress Liner (DSL) fabrication process. In this process, a tensile stress layer is deposited and patterned such that it overlies the source, drain and gate of the NMOS device. A compressive stress layer is then deposited and patterned such that it overlies the source, drain and gate of the PMOS device. This process forms NMOS devices and PMOS devices that are typically referred to as DSL NMOS devices and DSL PMOS devices.

Dual stress liner processes form DSL PMOS devices and DSL NMOS devices having high power and high performance characteristics. More particularly they have high saturation drain current (Idsat) and low leakage current (Ioff). Though the use of conventional DSL NMOS and DSL PMOS devices is sufficient for many applications, integrated circuit designers may require NMOS devices and PMOS devices having different performance levels. Accordingly, there is a need for NMOS devices and PMOS devices that have higher performance levels than traditional non-stressed NMOS and PMOS devices, but not as high as the performance characteristics provided by conventional DSL fabrication processes.

SUMMARY

An embodiment of a method for forming an integrated circuit device is disclosed that includes generating an integrated circuit device design that includes a dual stress liner NMOS cell, a dual stress liner PMOS cell, a reduced-stress dual stress liner NMOS cell and a reduced-stress dual stress liner PMOS cell. An integrated circuit device is then fabricated using the layout so as to form an integrated circuit device having the dual stress liner NMOS cell, the dual stress liner PMOS cell, the reduced-stress dual stress liner NMOS cell and the reduced-stress dual stress liner PMOS cell. A cell library can be provided that includes the dual stress liner NMOS cell, the dual stress liner PMOS cell, the reduced-stress dual stress liner NMOS cell and the reduced-stress dual stress liner PMOS cell.

An embodiment of a method for forming an integrated circuit device includes generating an initial integrated circuit device design; forming a plurality of dual stress liner NMOS devices that include a tensile stress layer that overlies a first NMOS gate film stack; forming a plurality of dual stress liner PMOS devices that include a compressive stress layer that overlies a first PMOS gate film stack; testing the initial integrated circuit device design; revising the initial integrated circuit design if the initial integrated circuit design does not pass the testing; forming a reduced-stress dual stress liner NMOS device having a first stress reduction layer that extends between the tensile stress layer and a second NMOS gate film stack; and forming a reduced-stress dual stress liner PMOS device that includes a second PMOS gate film stack, the first stress reduction layer extending between the compressive stress layer and the second PMOS gate film stack.

An integrated circuit device is disclosed that includes a dual stress liner NMOS device having a tensile stress layer that overlies a NMOS gate film stack, a dual stress liner PMOS device having a compressive stress layer that overlies a PMOS gate film stack, a reduced-stress dual stress liner NMOS device having a stress reduction layer that extends between the tensile stress layer and the NMOS gate film stack, and a reduced-stress dual stress liner PMOS device having a stress reduction layer that extends between the compressive stress layer and the PMOS gate film stack. The reduced-stress dual stress liner NMOS device and the reduced-stress dual stress liner PMOS device are implemented if an initial integrated circuit device design does not pass testing.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention. In the drawings.

DETAILED DESCRIPTION

Figure 1A:
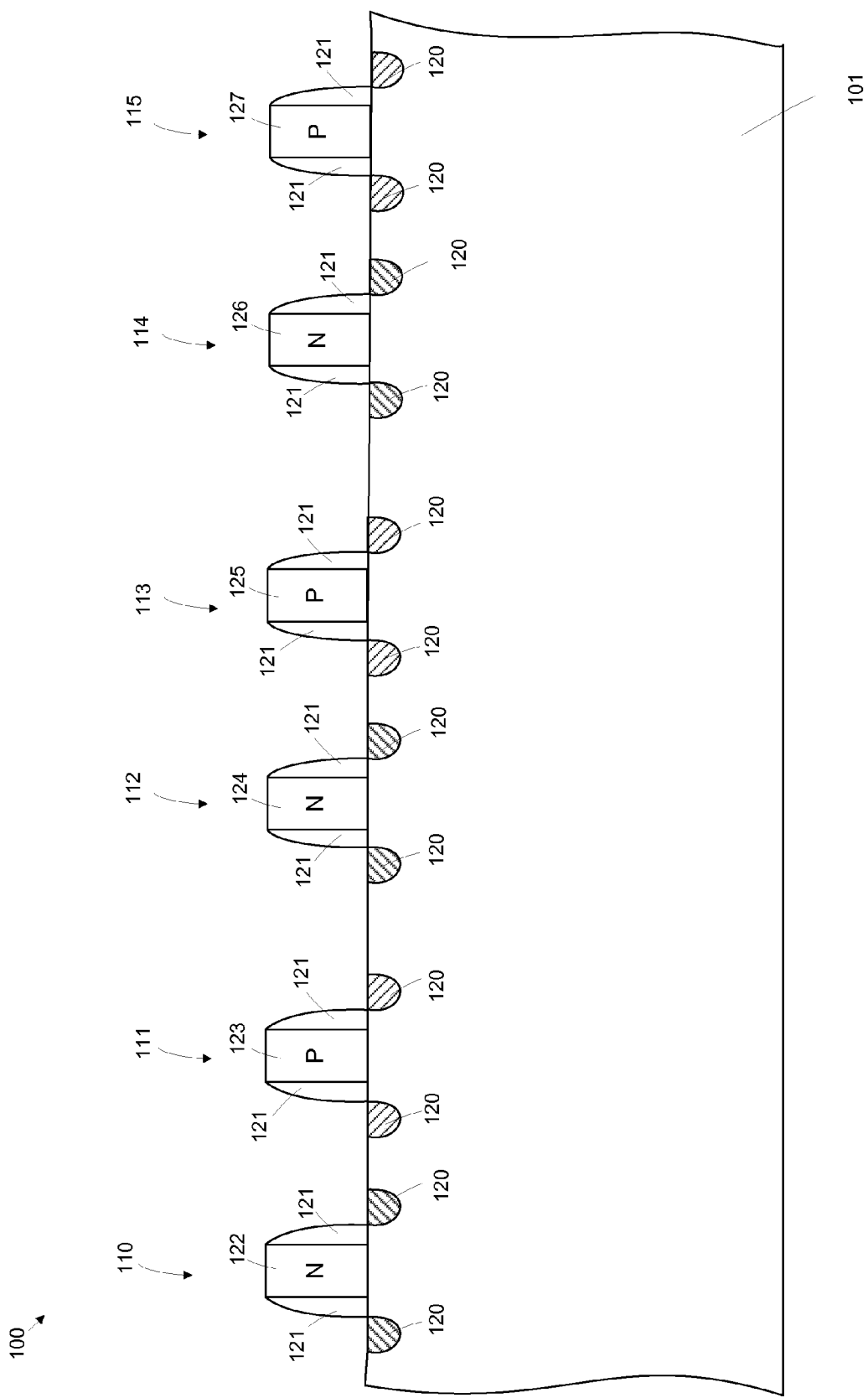
FIG. 1A shows a cross sectional view of a semiconductor wafer over which gate film stacks, spacers and source and drain regions have been formed in accordance with an embodiment of the present invention.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

FIGS. 1A-1H show a process for forming an integrated circuit device 100 that includes a Dual Stress Liner (DSL) NMOS device 110, a DSL PMOS device 111, a reduced-stress DSL NMOS device 112, a reduced-stress DSL PMOS device 113. Moreover, integrated circuit device 100 includes an additional reduced-stress DSL NMOS device 114 and an additional reduced-stress DSL PMOS device 115. In the present embodiment, all of devices 110-115 are formed using a dual-stress liner fabrication process in which a tensile stress layer 141 is formed over each NMOS gate film stack 110, 112 and 114, and a compressive stress layer 142 is formed over each PMOS gate film stack 111, 113 and 135 so as to stress the channel of each of devices 110-115, providing improved carrier mobility in devices 110-115. Reduced-stress DSL NMOS devices 112 and 114 include a stress reduction layer (131 and 132) that extends between the tensile stress layer 141 and NMOS gate film stacks 124 and 126. Reduced-stress DSL PMOS device 113 and 115 include a stress reduction layer (131 and 132) that extends between the compressive stress layer 142 and NMOS gate film stacks 125 and 127.

Referring now to FIG. 1A, gate film stacks 122-127 are shown to be formed over a semiconductor substrate 101, with spacers 121 formed on opposite sides of each gate film stack 122-127. Source/drain regions 120 are formed within semiconductor substrate 101 such that a source region 120 extends on one side of each gate film stack 122-127 and a drain region 120 extends on the opposite side of the gate film stack 122-127. In the present embodiment, a silicon-on-insulator SOI process is used to form the structures shown in FIG. 1A, with semiconductor substrate 101 including a buried oxide layer and one or more shallow trench isolation regions. Each gate film stack 122-127 includes a plurality of different layers of material, including a dielectric layer that directly overlies semiconductor substrate 101 and one or more overlying layers of conductive material. Source/drain regions 120 can be formed by implanting impurities into semiconductor substrate 101 and performing an anneal process step. Though source/drain regions 120 are shown to extend outside of spacers 121, it is appreciated that many different configuration of source and drain regions 120 can be used, including embodiments in which source/drain regions 120 extend under spacers 121.

Figure 1B:
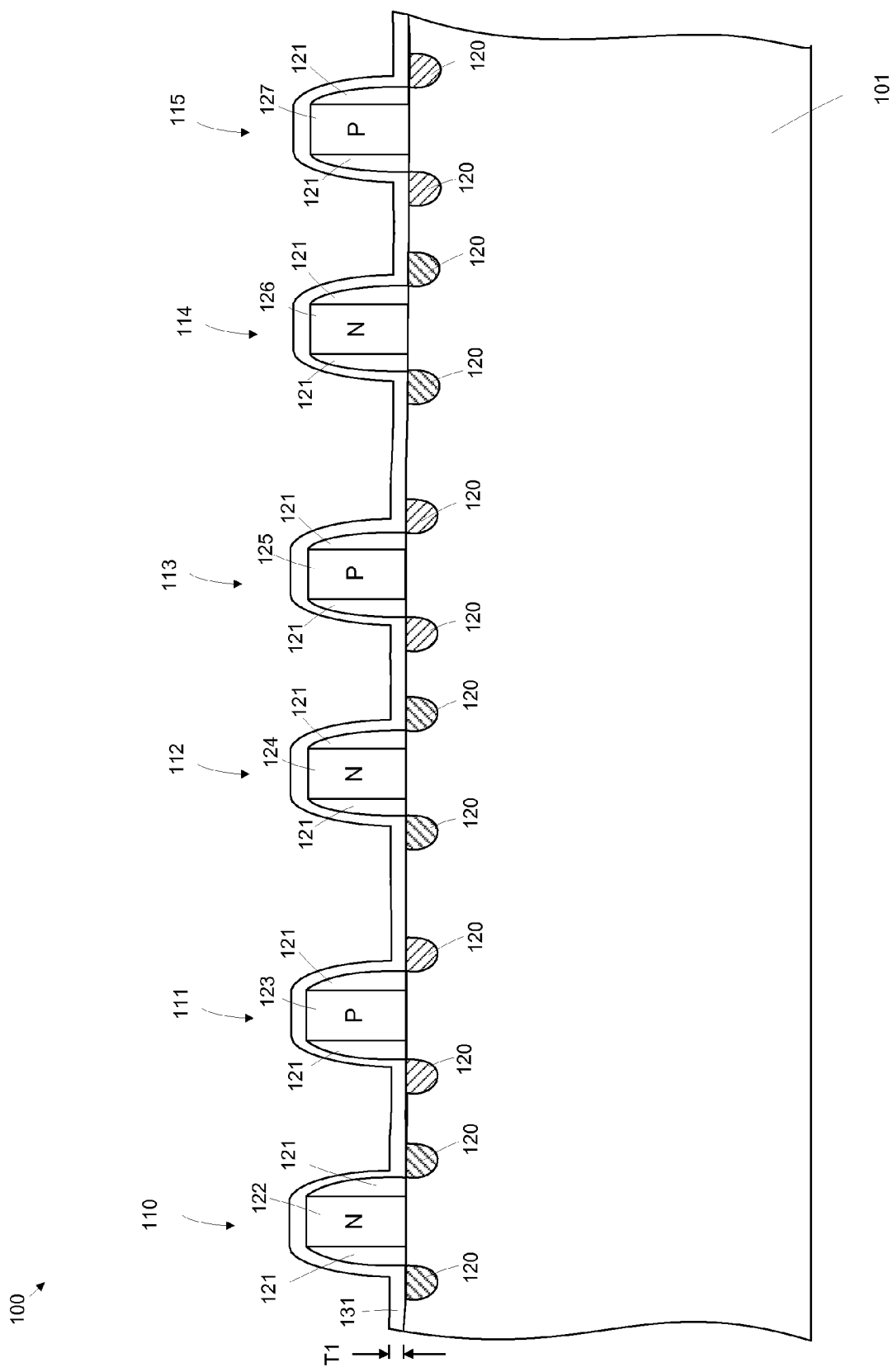
FIG. 1B shows the semiconductor wafer of FIG. 1A after a first stress reduction layer has been deposited thereover in accordance with an embodiment of the present invention.

Referring now to FIG. 1B a stress reduction layer 131 is deposited over semiconductor substrate 101. In one embodiment stress reduction layer 131 is a layer of oxide. In another embodiment, stress reduction layer 131 is a layer of nitride ($SiON_x$). Stress reduction layer 131 has a thickness T1 and immediately overlies gate film stacks 122-127, source/drain regions 120 and spacers 121.

Figure 1C:
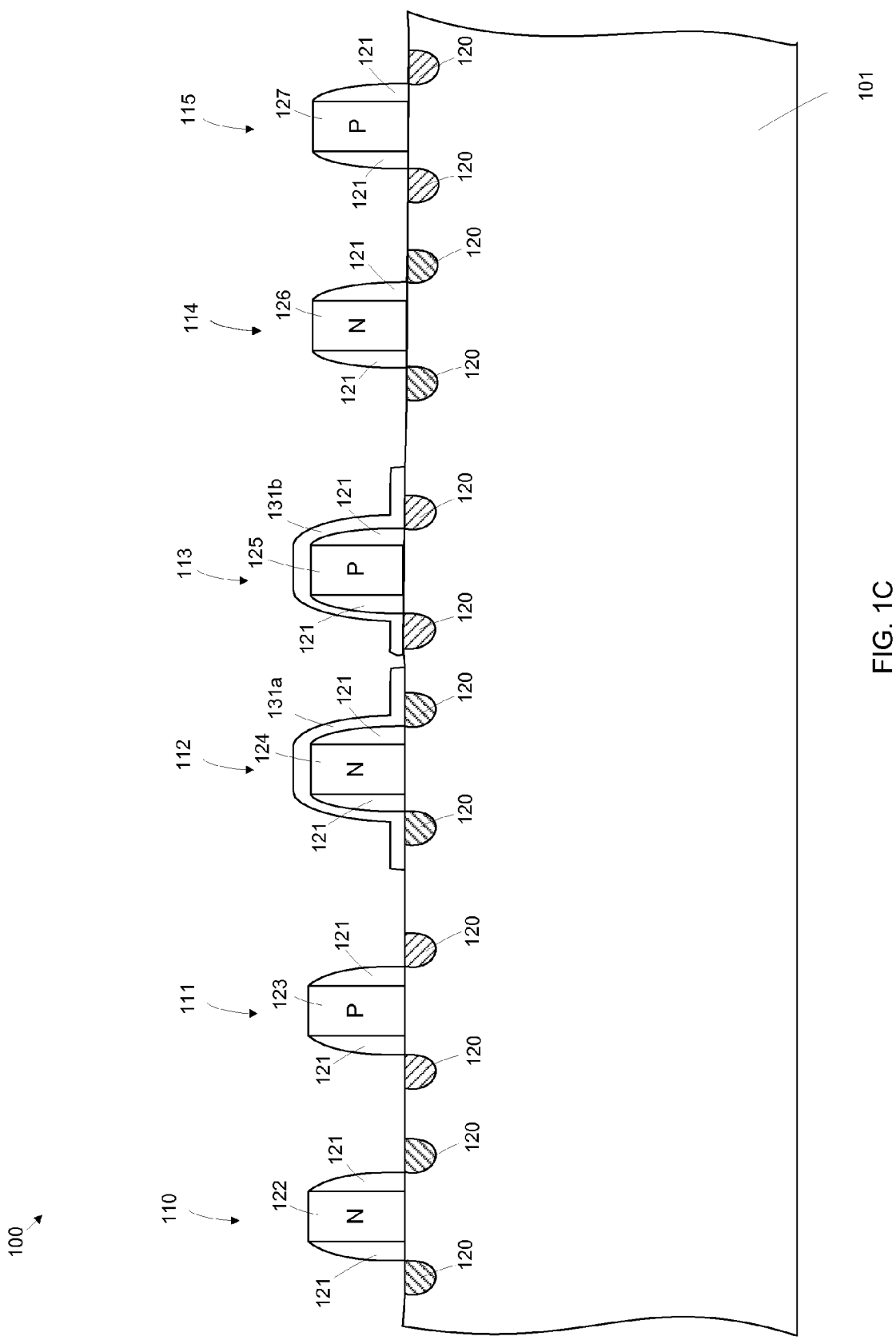
FIG. 1C shows the semiconductor wafer of FIG. 1B after patterning of the first stress reduction layer in accordance with an embodiment of the present invention.

Referring now to FIG. 1C, mask and etch steps are performed to pattern stress reduction layer 131. In the present embodiment a photoresist layer is deposited, exposed and a reactive ion etch is performed remove portions of stress reduction layer 131, forming stress reduction region 131a and stress reduction region 131b. Stress reduction region 131a extends immediately over gate film stack 124, source/drain regions 120 and spacers 121 that extend on opposite sides of gate film stack 124. Stress reduction region 131b extends immediately over gate film stack 125, source/drain regions 120 and spacers 121 that extend on opposite sides of gate film stack 125.

Figure 1D:
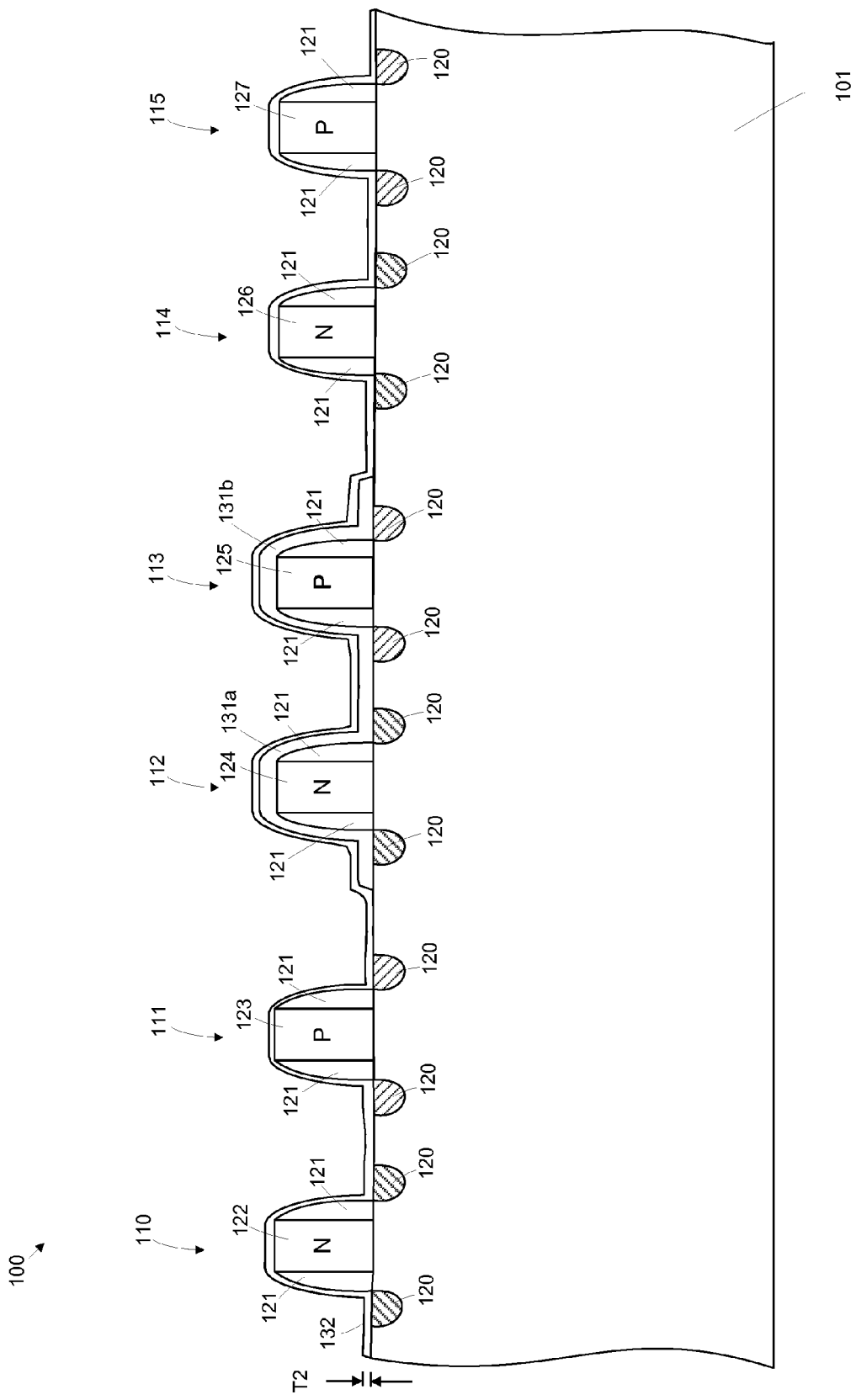
FIG. 1D shows the semiconductor wafer of FIG. 1C after a second stress reduction layer has been deposited thereover in accordance with an embodiment of the present invention.

Referring now to FIG. 1D a stress reduction layer 132 is deposited over semiconductor substrate 101. In one embodiment stress reduction layer 132 is a layer of oxide. In another embodiment, stress reduction layer 132 is a layer of nitride ($SiON_x$). Stress reduction layer 132 has a thickness T2 and immediately overlies gate film stacks 122-123 and 126-127. Also, stress reduction layer 132 immediately overlies stress reduction regions 131a and 131b.

Figure 1E:
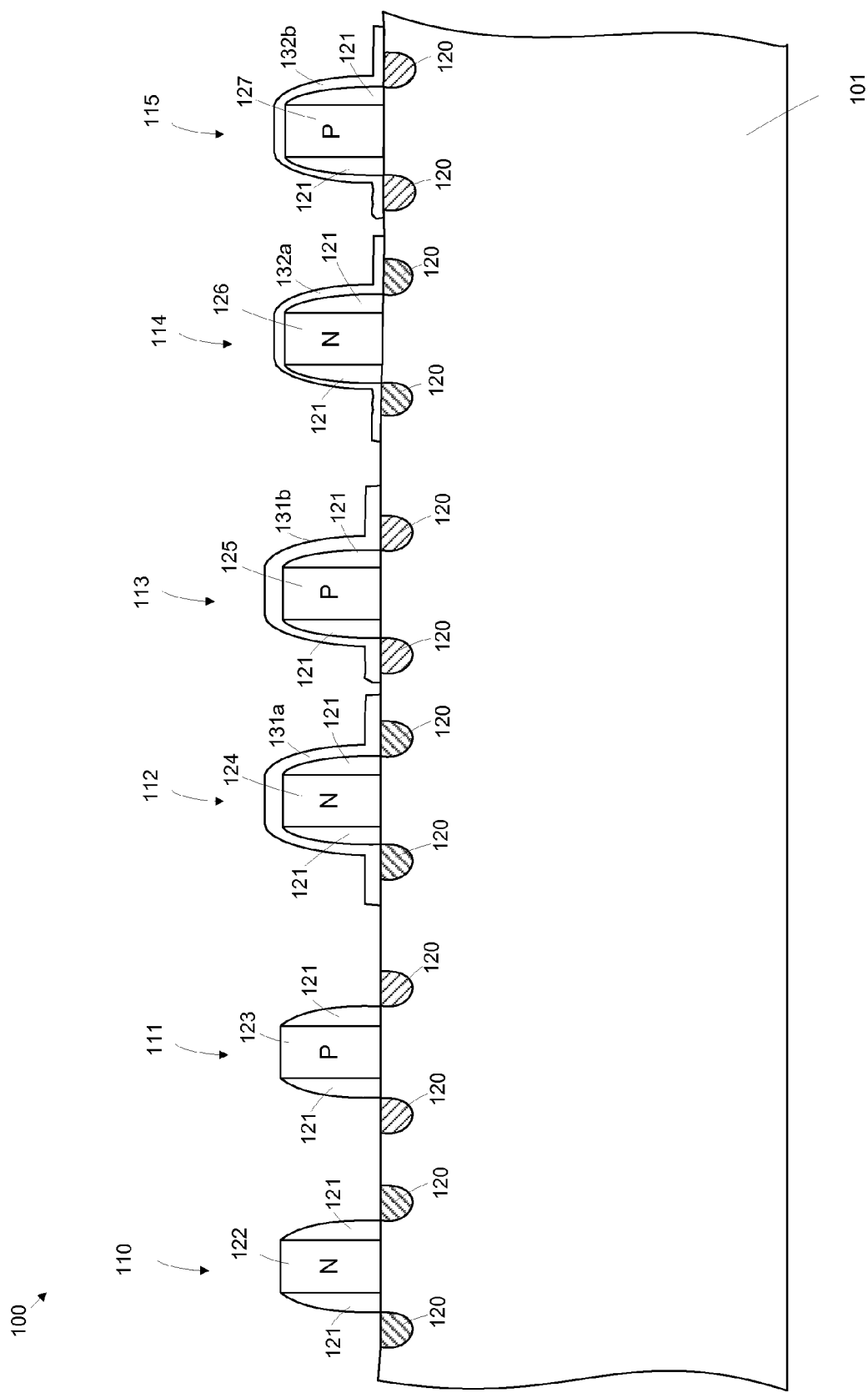
FIG. 1E shows the semiconductor wafer of FIG. 1D after patterning of the second stress reduction layer in accordance with an embodiment of the present invention.

Referring now to FIG. 1E, mask and etch steps are performed to pattern stress reduction layer 132. In the present embodiment a photoresist layer is deposited, exposed and an etch step is performed to remove portions of stress reduction layer 132, forming stress reduction region 132a and stress reduction region 132b. Stress reduction region 132a extends immediately over gate film stack 126, source/drain regions 120 and spacers 121 that extend on opposite sides of gate film stack 126. Stress reduction region 132b extends immediately over gate film stack 127, source/drain regions 120 and spacers 121 that extend on opposite sides of gate film stack 127.

Though FIGS. 1C-1F show a space between stress reduction region 131a and 131b and a space between stress reduction region 132a and 132b, in alternate embodiments there is no space, with stress reduction regions 131a and 131b being contiguous and stress reduction regions 132a-132b being contiguous.

Figure 1F:
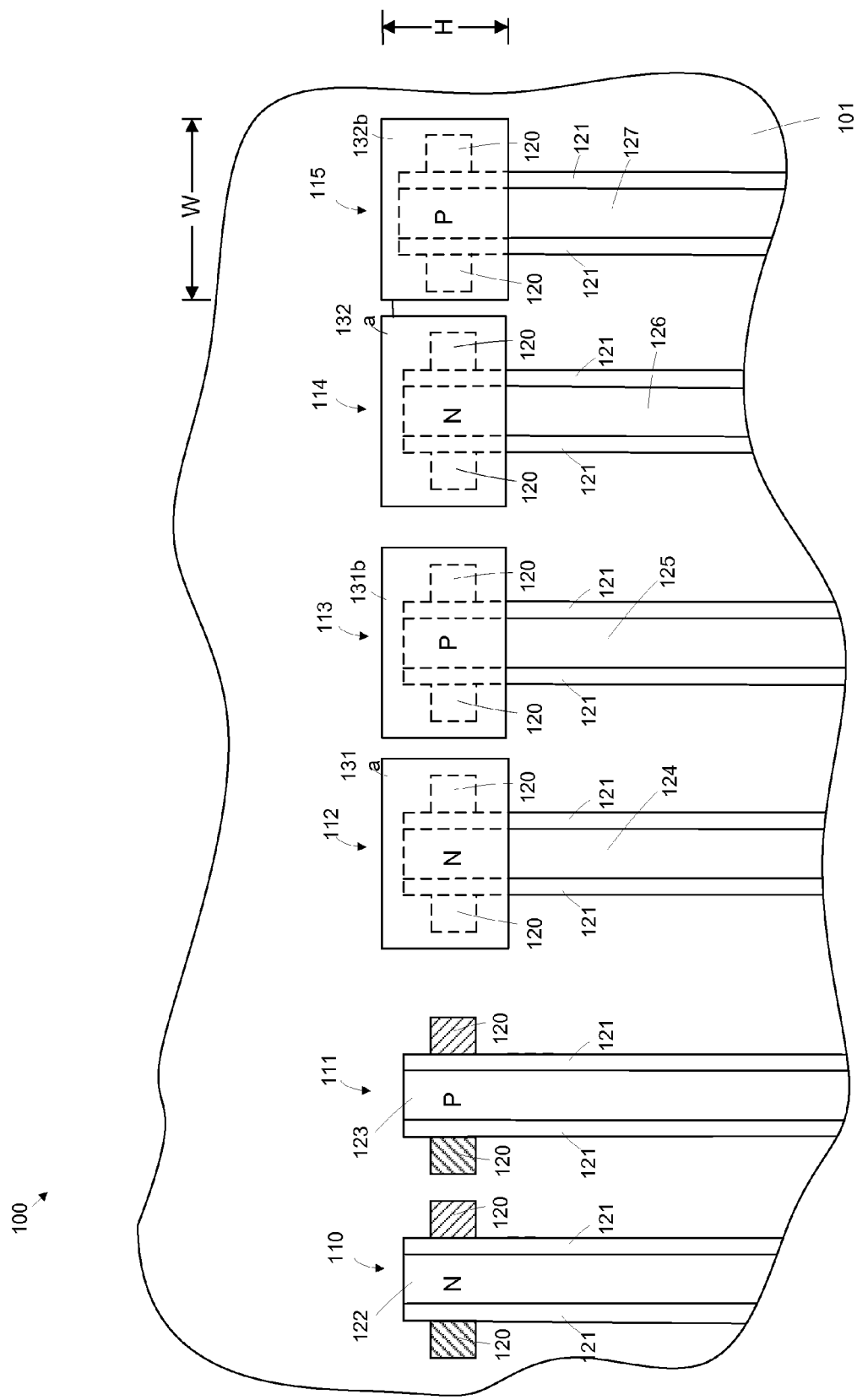
FIG. 1F shows a top view of a portion of the semiconductor wafer of FIG. 1E in accordance with an embodiment of the present invention.

FIG. 1F shows stress reduction region 132b to be rectangular and to have a height H and a width W. In the present embodiment the shape of each of stress reduction regions 131a, 131b and 132a are identical to the shape of stress reduction region 132b, with each having the same height H and width W.

In one embodiment stress reduction layers 131 and 132 are silicon oxinitride (SiON). In one specific embodiment layers 131 and 132 are Plasma Enhanced Chemical Vapor Deposition (PECVD) SiON, with layer 131 having a thickness of approximately 250 Angstroms and layer 132 having a thickness of approximately 125 Angstroms.

Figure 1G:
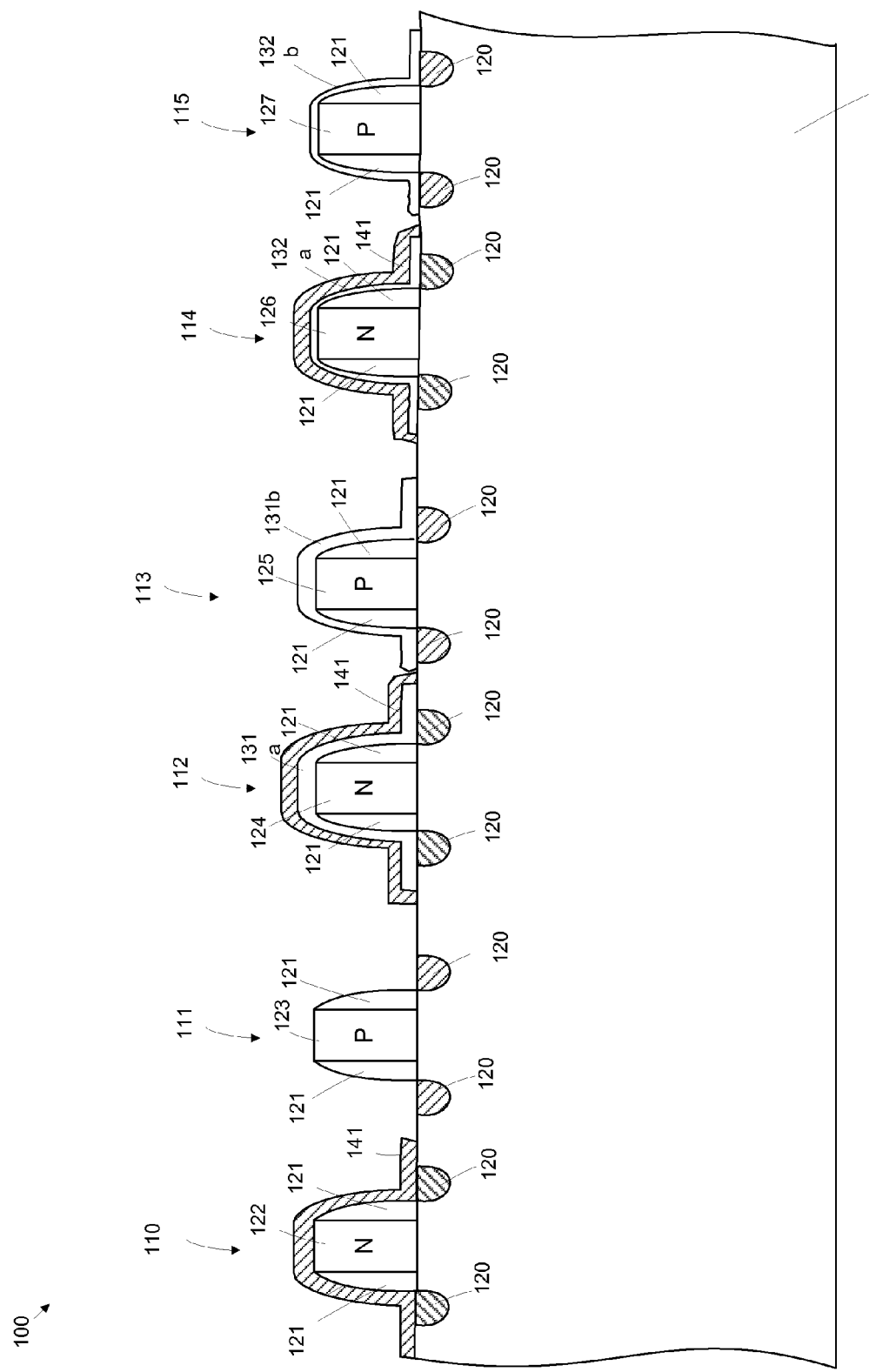
FIG. 1G shows the semiconductor wafer of FIG. 1E after a tensile stress layer has been deposited and patterned in accordance with an embodiment of the present invention.

A tensile stress layer 141 is deposited over the top surface of semiconductor substrate 101 and is patterned to form the structure shown in FIG. 1G. In one embodiment tensile stress layer 141 is a layer of silicon nitride (SiN) having a thickness of approximately 250 Angstroms that is deposited at 480 degrees centigrade such that it has intrinsic tensile stress. In the present embodiment tensile stress layer 141 is deposited, followed by deposition and exposure of a layer of photoresist, and a reactive ion etch process that removes portions of tensile stress layer 141. In the present embodiment a first portion of tensile stress layer 141 extends immediately over gate film stack 122, and immediately over the source/drain regions 120 and spacers 121 that extend on opposite sides of gate film stack 122. A second portion of tensile stress layer 141 extends immediately over stress reduction region 131a, directly over gate film stack 124 and directly over the source/drain regions 120 and spacers 121 that extend on opposite sides of gate film stack 124. A third portion of tensile stress layer 141 extends immediately over stress reduction region 132a, directly over gate film stack 126 and directly over the source/drain regions 120 and spacers 121 that extend on opposite sides of gate film stack 126.

Figure 1H:
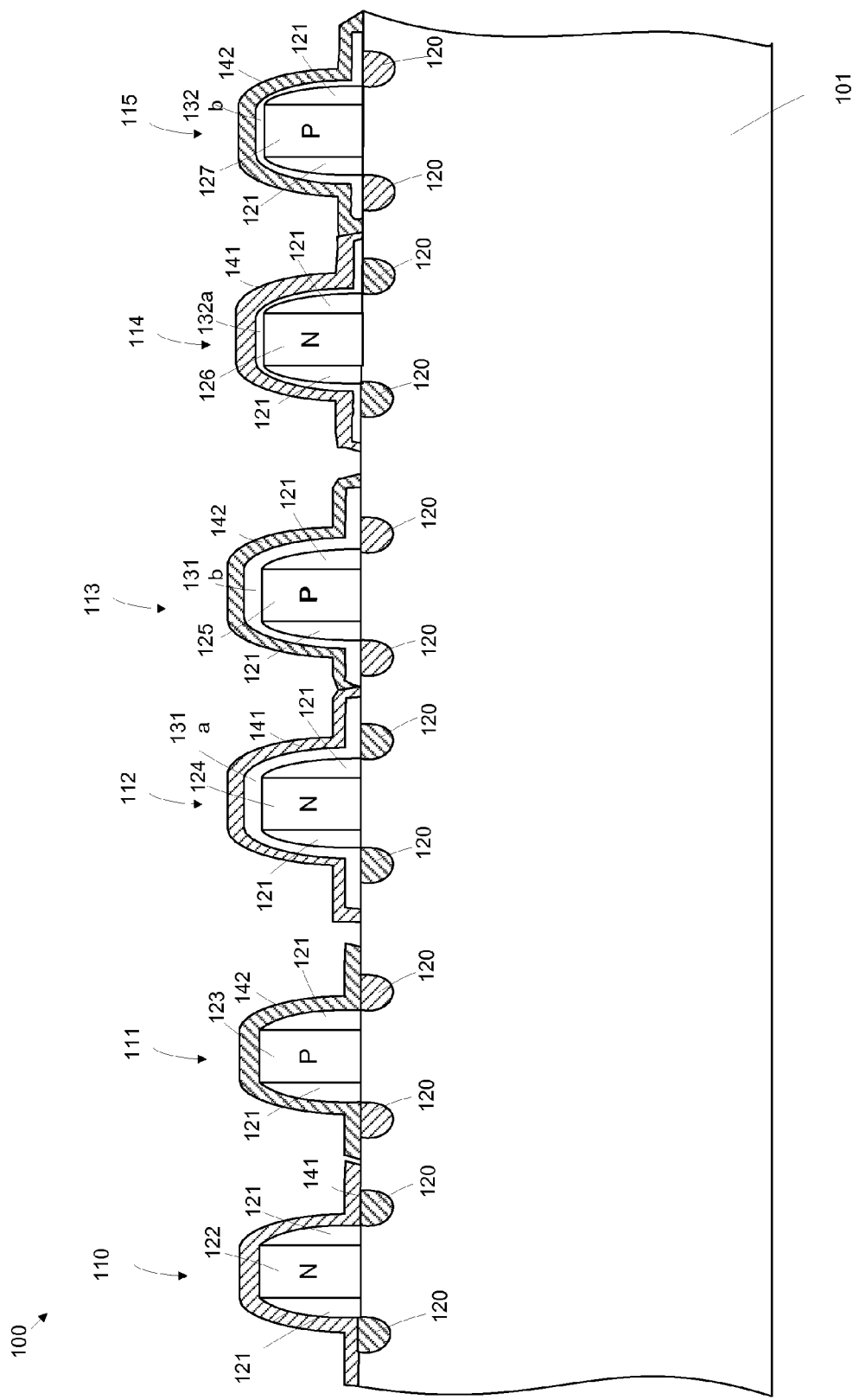
FIG. 1H shows the semiconductor wafer of FIG. 1G after a compressive stress layer has been deposited and patterned in accordance with an embodiment of the present invention.

A compressive stress layer 142 is deposited over the top surface of semiconductor substrate 101 and is patterned to form the structure shown in FIG. 1H. In one embodiment compressive stress layer 142 is a layer of silicon nitride (SiN) having a thickness of approximately 250 Angstroms that is deposited at 480 degrees centigrade such that it has intrinsic compressive stress. In the present embodiment compressive stress layer 142 is deposited, followed by deposition and exposure of a layer of photoresist, and a reactive ion etch process that removes portions of compressive stress layer 142 to form the structure shown in FIG. 1H. A first portion of compressive stress layer 142 extends immediately over gate film stack 123, and immediately over the source/drain regions 120 and spacers 121 that extend on opposite sides of gate film stack 123. A second portion of compressive stress layer 142 extends immediately over stress reduction region 131b, directly over gate film stack 125 and directly over the source/drain regions 120 and spacers 121 that extend on opposite sides of gate film stack 125. A third portion of compressive stress layer 142 extends immediately over stress reduction region 132b, directly over gate film stack 127 and directly over the source/drain regions 120 and spacers 121 that extend on opposite sides of gate film stack 127.

The process of FIGS. 1A-1H form a DSL NMOS device 110 and a DSL PMOS device 111 that are conventional dual stress liner NMOS and PMOS devices as are known in the art. In one embodiment DSL NMOS device 110 and DSL PMOS device 111 are formed using the processes and materials disclosed in "High Volume Manufacturing Ramp in 90 nm Dual Stress Liner Technology," R. Gehres et al., 2006 *IEEE/SEMI Advanced Semiconductor Manufacturing Conference*, which is incorporated by reference herein in its entirety.

Because stress reduction layer 131 extends between tensile stress layer 141 and the other components of reduced-stress DSL NMOS device 112, the tensile stress imparted to reduced-stress DSL NMOS device 112 is less than that of DSL NMOS device 110. Similarly, because stress reduction layer 131 extends between compressive stress layer 142 and the other components of reduced-stress DSL PMOS device 113, the tensile stress imparted to reduced-stress DSL PMOS device 113 is less than that of DSL PMOS device 111.

Because stress reduction layer 131 extends between tensile stress layer 141 and the other components of reduced-stress DSL NMOS device 112, the tensile stress imparted to the channel of reduced-stress DSL NMOS device 112 is less than that in the channel of DSL NMOS device 110. Similarly, because stress reduction layer 131 extends between compressive stress layer 141 and the other components of reduced-stress DSL PMOS device 113, the compressive stress imparted to the channel of reduced-stress dual DSL PMOS device 113 is less than the stress in the channel of DSL PMOS device 111.

In the present embodiment stress reduction layer 132 has a thickness that is less than the thickness of stress reduction layer 131. According, the amount of stress reduction will be less than that provided by stress reduction layer 131. Thus, the tensile stress imparted to the channel of reduced-stress DSL NMOS device 114 is less than the tensile stress in the channel of DSL NMOS device 110 but is more than the tensile stress in the channel of DSL NMOS device 112. Similarly, the compressive stress imparted to the channel of reduced-stress DSL PMOS device 115 is less than the tensile stress in the channel of DSL PMOS device 111 but is more than the tensile stress in the channel of DSL NMOS device 113. Accordingly the saturation drain current (Idsat) at a given voltage (e.g., 1.2 Volts) will be highest for DSL NMOS device 110.

Reduced-stress DSL NMOS device 112 will have an Idsat that is lower than the Idsat of DSL NMOS device 110. Reduced-stress DSL NMOS device 114 will have an Idsat that is lower than the Idsat of DSL NMOS device 110 and greater than the Idsat of reduced-stress DSL NMOS device 112. Similarly, reduced-stress DSL PMOS device 113 will have an Idsat that is lower than the Idsat of DSL PMOS device 111. Reduced-stress DSL PMOS device 115 will have an Idsat that is lower than the Idsat of DSL PMOS device 111 and greater than the Idsat of reduced-stress DSL PMOS device 113.

Reduced-stress DSL NMOS device 112 will have an on-current (Ion) that is lower than the Ion of DSL NMOS device 110. Reduced-stress DSL NMOS device 114 will have an Ion that is lower than the Ion of DSL NMOS device 110 and greater than the Ion of reduced-stress DSL NMOS device 112. Similarly, reduced-stress DSL PMOS device 113 will have an Ion that is lower than the Ion of DSL NMOS device 111. Reduced-stress DSL PMOS device 115 will have an Ion that is lower than the Ion of DSL PMOS device 111 and greater than the Ion of reduced-stress DSL PMOS device 113.

Reduced-stress DSL NMOS device 112 will have an off-current (Ioff) that is higher than the Ioff of DSL NMOS device 110. Reduced-stress DSL NMOS device 114 will have an Ioff that is higher than the Ioff of DSL NMOS device 110 and lower than the Ioff of reduced-stress DSL NMOS device 112. Similarly, reduced-stress DSL PMOS device 113 will have an Ioff that is higher than the Ioff of DSL PMOS device 111. Reduced-stress DSL PMOS device 115 will have an Ioff that is higher than the Ioff of DSL PMOS device 111 and lower than the Ioff of reduced-stress DSL PMOS device 113.

In one embodiment stress reduction layer 132 has a thickness that is approximately half of the thickness of stress reduction layer 131. Accordingly, the stress levels in the channel of reduced-stress DSL NMOS device 114 is approximately half of the stress in the channel of reduced-stress DSL NMOS device 112. Similarly, the stress levels in the channel of reduced-stress DSL PMOS device 115 is approximately half the stress levels in the channel of reduced-stress DSL NMOS device 113.

By using the same size stress reduction regions and the same material, and varying only the thickness of the stress reduction layer, the performance characteristics of reduced-stress DSL NMOS devices 112 and 114 vary from the performance characteristics of DSL NMOS device 110 by a known amount, providing an integrated circuit device 100 having NMOS devices 110, 112 and 114 with varying performance characteristics. Similarly, by using the same size stress reduction regions and the same material, and varying only the thickness of the stress reduction layer, the performance characteristics of reduced-stress DSL PMOS devices 113 and 115 vary from the performance characteristics of DSL PMOS device 111 by a known amount, providing an integrated circuit device 100 having PMOS devices 111, 113 and 115 with varying performance characteristics.

Though the embodiment shown in FIGS. 1A-1H show two reduced-stress DSL NMOS devices and two reduced-stress PMOS devices having performance characteristics that vary as a result of using a stress reduction layer 131 having a first thickness and a stress reduction layer 132 having a second thickness that is approximately half of the first thickness, in other embodiments integrated circuit device 100 includes more reduced-stress NMOS devices and reduced-stress PMOS devices that have different thicknesses, providing NMOS devices and PMOS devices having different performance characteristics.

In addition to varying performance characteristics by varying the thickness of stress reduction layers 131 and 132, in one embodiment performance characteristics are altered by providing stress reduction layers 131 and 132 formed using different materials. In one such embodiment an additional set of reduced-stress DSL NMOS and DSL PMOS devices are provided that are identical to reduced-stress DSL NMOS device 112 and reduced-stress PMOS device 113 except that the material of stress reduction layer 131 is different. For example, the stress reduction layer can be a layer of nitride having a higher nitride concentration than stress reduction layer in reduced-stress DSL NMOS device 112 and reduced-stress DSL PMOS device 113, providing a particular set of performance characteristics. This can be combined with variations in thickness of stress reduction layers 131 and 132 to provide even more DSL NMOS and DSL PMOS devices having different performance characteristics. In one such embodiment an additional set of reduced-stress DSL NMOS and PMOS devices are provided that are identical to reduced-stress DSL NMOS device 114 and reduced-stress PMOS device 115 except that the material of stress reduction layer 132 is different. For example, the stress reduction layer 132 can have a higher nitride concentration than stress reduction layer 132 in reduced-stress DSL NMOS device 114 and reduced-stress DSL PMOS device 115.

In one specific embodiment integrated circuit device 100 includes ten different DSL devices, DSL devices 110-115 shown in FIGS. 1A-1H where stress reduction layers 131-132 are formed of the same material and have a first nitride concentration, and reduced-stress DSL NMOS devices that are identical to reduced-stress DSL NMOS device 112 and reduced-stress PMOS device 113 except that the stress reduction layer 131 has a second nitride concentration that is less than the first nitride concentration. In this embodiment an additional set of reduced-stress DSL NMOS and PMOS devices are provided that are identical to reduced-stress DSL NMOS device 114 and reduced-stress PMOS device 115 except that stress reduction layer 132 has the second nitride concentration.

Figure 2:
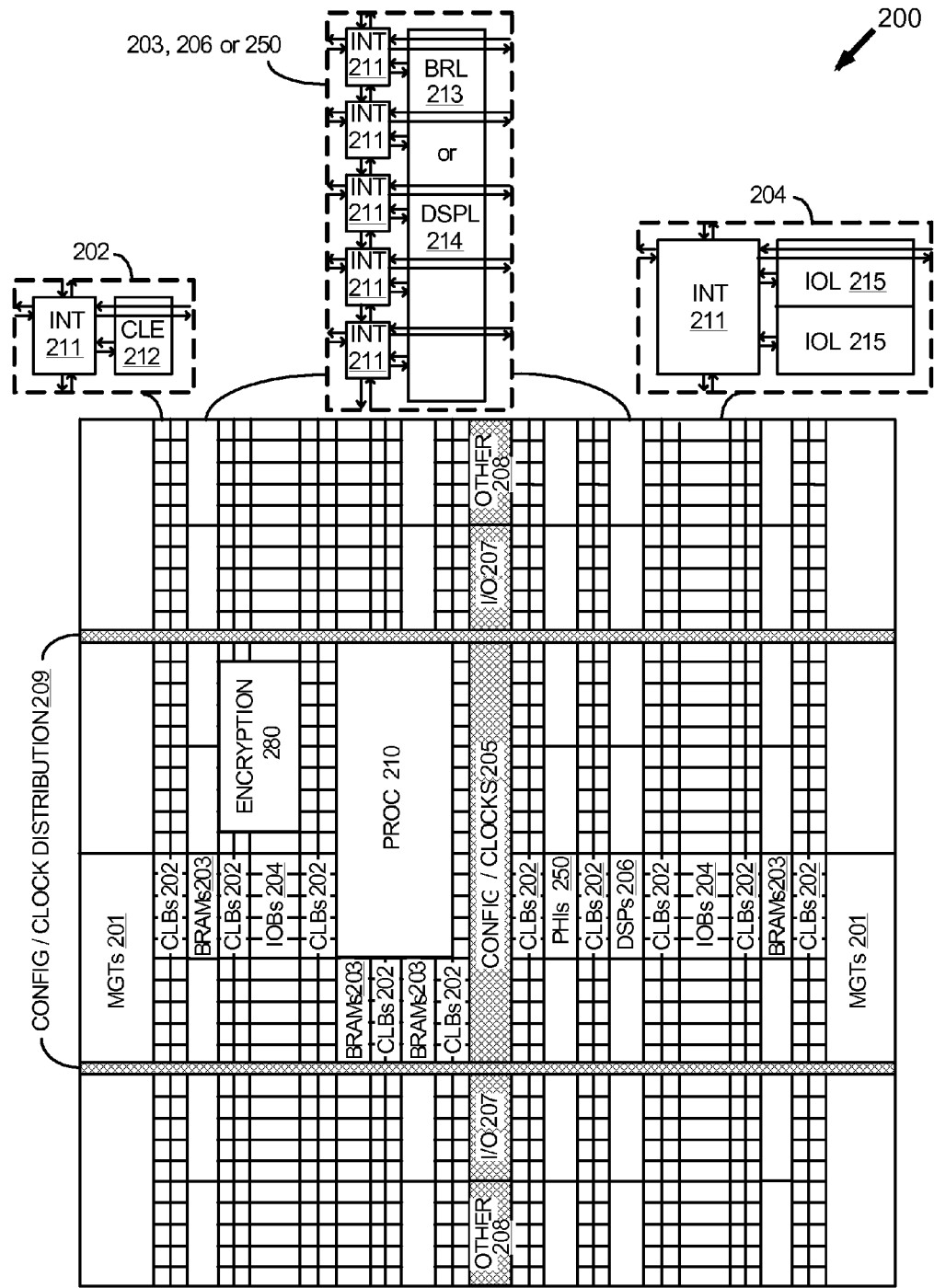
FIG. 2 shows a field programmable gate array architecture in accordance with an embodiment of the present invention.

In the embodiment that is shown in FIG. 2 integrated circuit device 100 is a Field Programmable Gate Area (FPGA) die having a FPGA architecture 200 that includes a large number of different programmable tiles including multi-gigabit transceivers (MGTs 201), configurable logic blocks (CLBs 202), random access memory blocks (BRAMs 203), input/output blocks (IOBs 204), configuration and clocking logic (CONFIG/CLOCKS 205), digital signal processing blocks (DSPs 206), specialized input/output blocks (I/O 207) (e.g., configuration ports and clock ports), interface tiles (PHIs) 250 and other programmable logic 208 such as digital clock managers, analog-to-digital converters, system monitoring logic, and so forth. In addition, integrated circuit device 100 may include one or more dedicated processor blocks (PROC 210) and/or an encryption logic block (ENCR 280).

In some FPGAs, each programmable tile includes a programmable interconnect element (INT 211) having standardized connections to and from a corresponding interconnect element in each adjacent tile. Therefore, the programmable interconnect elements taken together implement the programmable interconnect structure for the illustrated FPGA. The programmable interconnect element (INT 211) also includes the connections to and from the programmable logic element within the same tile, as shown by the examples included at the top of FIG. 2.

For example, a CLB 202 can include a configurable logic element (CLE 212) that can be programmed to implement user logic plus a single programmable interconnect element (INT 211). A BRAM 203 can include a BRAM logic element (BRL 213) in addition to one or more programmable interconnect elements. Typically, the number of interconnect elements included in a tile depends on the height of the tile. In the pictured embodiment, a BRAM tile has the same height as five CLBs, but other numbers (e.g., six) can also be used. A DSP tile 206 can include a DSP logic element (DSPL 214) in addition to an appropriate number of programmable interconnect elements. An 10B 204 can include, for example, two instances of an input/output logic element (IOL 215) in addition to one instance of the programmable interconnect element (INT 211). As will be clear to those of skill in the art, the actual I/O pads connected, for example, to the I/O logic element 215 are manufactured using metal layered above the various illustrated logic blocks, and typically are not confined to the area of the input/output logic element 215.

Configuration/clock distribution logic 309 includes configuration, clock, and other control logic. Horizontal areas 209 extending from this column are used to distribute the clocks and configuration signals across the breadth of the FPGA.

Some FPGAs utilizing the architecture illustrated in FIG. 2 include additional logic blocks that disrupt the regular columnar structure making up a large part of the FPGA. The additional logic blocks can be programmable blocks and/or dedicated logic. For example, the processor block PROC 210 shown in FIG. 2 spans several columns of CLBs and BRAMs.

FIG. 2 is intended to illustrate only an exemplary FPGA architecture. The numbers of logic blocks in a column, the relative width of the columns, the number and order of columns, the types of logic blocks included in the columns, the relative sizes of the logic blocks, the incorporation of hard blocks such as PROC 210, and the interconnect/logic implementations included at the top of FIG. 2 will vary in accordance with the requirements of each application. For example, in an actual FPGA more than one adjacent column of CLBs is typically included wherever the CLBs appear, to facilitate the efficient implementation of user logic, but the number of adjacent CLB columns varies with the overall size of the FPGA.

Figure 3:
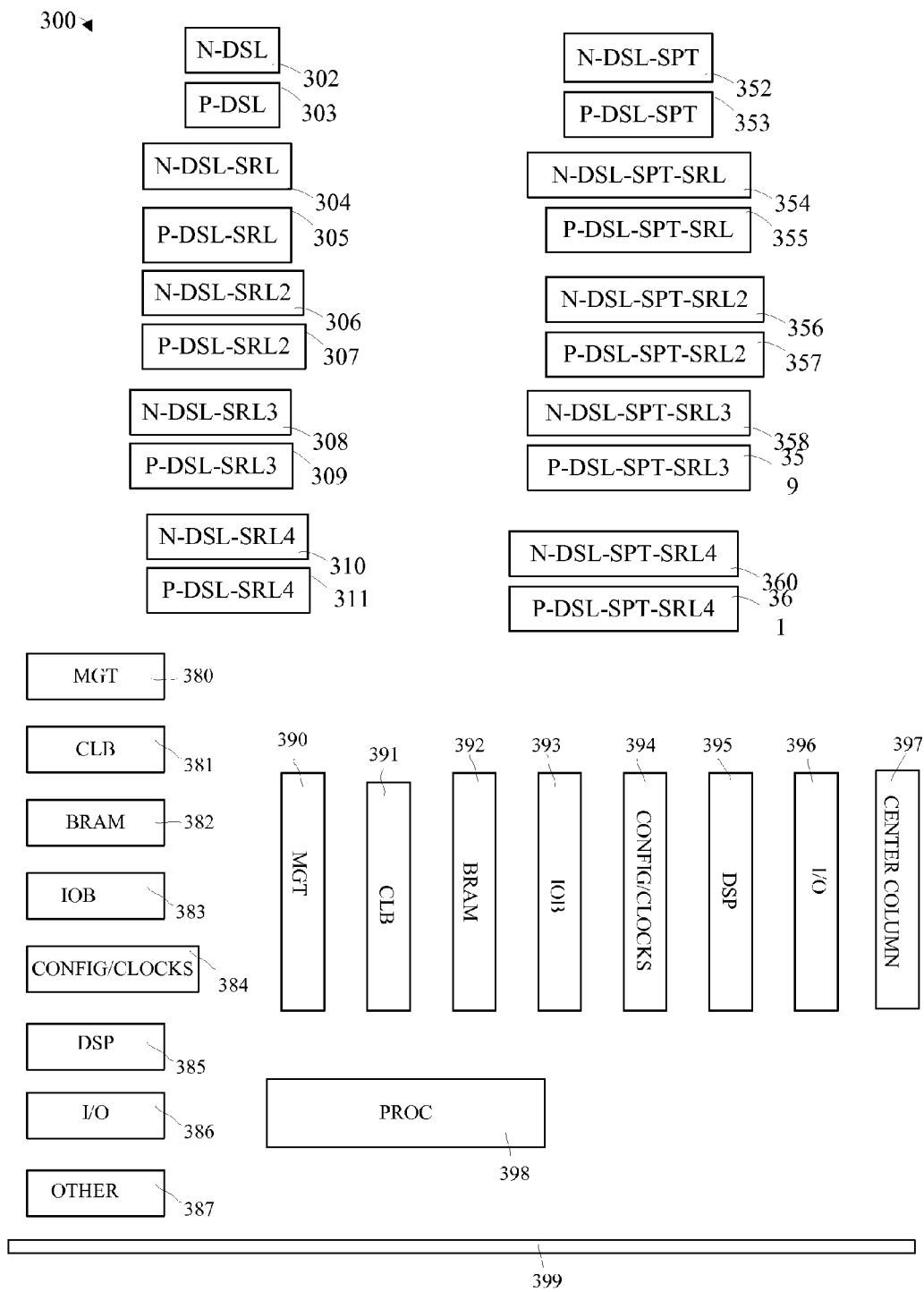
FIG. 3 is a diagram of a cell library that includes dual stress layer MOS cells, reduced-stress dual stress layer MOS cells, programmable tile cells, column cells and other cells that can be used for forming an integrated circuit device in accordance with an embodiment of the present invention.

FIG. 3 shows a cell library 300 that includes dual stress liner cells 302-303 that are formed using a conventional dual stress liner fabrication process and cells 304-311 that are identical to dual stress liner cells 302-303 except that they include a stress reduction layer. More particularly, a reduced stress DSL NMOS device (N-DSL-SRL) 304 is shown that is identical to DSL NMOS device (N-DSL) 302 except that it includes a stress reduction layer that extends between the tensile stress layer and the NMOS gate film stack. A reduced stress DSL PMOS device (P-DSL-SRL) 305 is shown that is identical to DSL PMOS device (P-DSL) 303 except that it includes a stress reduction layer that extends between the compressive stress layer and the PMOS gate film stack.

Continuing with FIG. 3, a reduced stress DSL NMOS device (N-DSL-SRL2) cell 306 is shown that is identical to reduced-stress DSL NMOS device cell 304 except that it includes a stress reduction layer that has a thickness that is approximately half of the thickness of the stress reduction layer in reduced-stress DSL NMOS device cell 304. A reduced stress DSL PMOS device (P-DSL-SRL2) cell 307 is shown that is identical to reduced-stress DSL PMOS device cell 305 except that it includes a stress reduction layer that has a thickness that is approximately half of the thickness of the stress reduction layer in reduced-stress DSL PMOS device cell 305.

In one specific embodiment cells 302-307 define the process shown in FIGS. 1A-1H, where DSL NMOS device cell 302 defines DSL NMOS device 110, DSL PMOS device cell 303 defines DSL PMOS device 111, reduced-stress DSL NMOS device cell 304 defines reduced-stress DSL PMOS device 112, reduced stress DSL PMOS device cell 305 defines reduced-stress DSL PMOS device 113, reduced stress DSL NMOS device cell 306 defines reduced-stress DSL PMOS device 114 and reduced stress DSL PMOS device cell 307 defines reduced-stress DSL PMOS device 115.

Continuing with FIG. 3, a reduced stress DSL NMOS device (N-DSL-SRL3) cell 308 is shown that is identical to reduced-stress DSL NMOS device cell 304 except that it includes a stress reduction layer that has a nitride concentration level that is approximately half of the nitride concentration of the stress reduction layer in reduced-stress DSL NMOS device cell 304. A reduced stress DSL PMOS device (P-DSL-SRL3) cell 309 is shown that is identical to reduced-stress DSL PMOS device cell 305 except that it has a stress reduction layer that has a nitride concentration that is approximately half of the nitride concentration of the stress reduction layer in reduced-stress DSL PMOS device cell 305.

In addition, a reduced stress DSL NMOS device (N-DSL-SRL4) cell 310 is shown that is identical to reduced-stress DSL NMOS device cell 306 except that it includes a stress reduction layer that has a nitride concentration level that is approximately half of the nitride concentration of the stress reduction layer in reduced-stress DSL NMOS device cell 306. A reduced stress DSL PMOS device (P-DSL-SRL4) cell 311 is shown that is identical to reduced-stress DSL PMOS device cell 307 except that it has a stress reduction layer that has a nitride concentration that is approximately half of the nitride concentration of the stress reduction layer in reduced-stress DSL PMOS device cell 307.

Continuing with FIG. 3, dual stress liner cells 352-361 are shown that are formed using a dual stress liner stress proximity technique fabrication process. More particularly, a DSL NMOS device (N-DSL-SPT) 352 and a DSL PMOS device (P-DSL-SPT) 353 are shown that are formed using a conventional dual stress liner stress proximity technique fabrication process. A reduced-stress DSL NMOS device (N-DSL-SPT-SRL) 354 is shown that is identical to DSL NMOS device (N-DSL-SPT) 352 except that it includes a stress reduction layer that extends between the tensile stress layer and the NMOS gate film stack. A reduced stress DSL PMOS device (P-DSL-SPT-SRL) 355 is shown that is identical to DSL PMOS device (P-DSL-SPT) 353 except that it includes a stress reduction layer that extends between the compressive stress layer and the PMOS gate film stack.

Continuing with FIG. 3, a reduced stress DSL NMOS device (N-DSL-SPT-SRL2) cell 356 is shown that is identical to reduced-stress DSL NMOS device cell 354 except that it includes a stress reduction layer that has a thickness that is approximately half of the thickness of the stress reduction layer in reduced-stress DSL NMOS device cell 354. A reduced stress DSL PMOS device (P-DSL-SPT-SRL2) cell 357 is shown that is identical to reduced-stress DSL PMOS device cell 355 except that it includes a stress reduction layer that has a thickness that is approximately half of the thickness of the stress reduction layer in reduced-stress DSL PMOS device cell 355.

A reduced stress DSL NMOS device (N-DSL-SPT-SRL3) cell 358 is shown that is identical to reduced-stress DSL NMOS device cell 354 except that it includes a stress reduction layer that has a nitride concentration level that is approximately half of the nitride concentration of the stress reduction layer in reduced-stress DSL NMOS device cell 354. A reduced stress DSL PMOS device (P-DSL-SPT-SRL3) cell 359 is shown that is identical to reduced-stress DSL PMOS device cell 355 except that it has a stress reduction layer that has a nitride concentration that is approximately half of the nitride concentration of the stress reduction layer in reduced-stress DSL PMOS device cell 355.

In addition, a reduced stress DSL NMOS device (N-DSL-SPT-SRL4) cell 360 is shown that is identical to reduced-stress DSL NMOS device cell 356 except that it includes a stress reduction layer that has a nitride concentration level that is approximately half of the nitride concentration of the stress reduction layer in reduced-stress DSL NMOS device cell 356. A reduced stress DSL PMOS device (P-DSL-SPT-SRL4) cell 361 is shown that is identical to reduced-stress DSL PMOS device cell 357 except that it has a stress reduction layer that has a nitride concentration that is approximately half of the nitride concentration of the stress reduction layer in reduced-stress DSL PMOS device cell 357.

In the present embodiment cell library 300 is a cell library for forming a Programmable Logic Device (PLD) such as FPGA 200 shown in FIG. 2. In this embodiment, cell library 300 includes a large number of different programmable tiles including multi-gigabit transceivers (MGTs 380), configurable logic blocks (CLBs 381), random access memory blocks (BRAMs 382), input/output blocks (IOBs 383), configuration and clocking logic (CONFIG/CLOCKS 384), digital signal processing blocks (DSPs 385), specialized input/output blocks (I/O 386) (e.g., configuration ports and clock ports), and other programmable logic (OTHER) 387 such as digital clock managers, analog-to-digital converters, system monitoring logic, and so forth. Processor cell 398 defines processor 210 and configuration/clock distribution cell 399 defines configuration/clock distribution logic 309.

Cell library 300 also includes columns 390-397 having substantially identical tiles of the associated circuit type. More particularly, column 390 is a column of MGT tiles, column 391 is a column of CLB tiles, column 392 is a column of BRAM tiles, column 393 is a column of 10B tiles, column 394 is a column of configuration and clock tiles, column 395 is a column of DSP tiles and column 396 is a column of input and output tiles. Center column 397 is a column that is made up of multiple different types of tiles. In the present embodiment, center column 397 includes configuration and clock tiles 384, input and output tiles 386 and other programmable logic 387.

The integrated circuit device design is then used to form an integrated circuit device. In one embodiment, the integrated circuit device that is formed using cell library 300 is a FPGA integrated circuit device having some or all of the features of architecture 200.

It is appreciated that the cells shown in FIG. 3 are exemplary as is the process shown in FIGS. 1A-1H, and that, in other embodiments cell library 300 includes additional reduced-stressed DSL NMOS and PMOS device cells that have different performance characteristics, formed by using different materials to form the stress reduction layer (e.g., different nitride concentrations) and/or by varying the thickness of the stress reduction layer and/or by varying the size or shape of the stress reduction layer.

Figure 4:
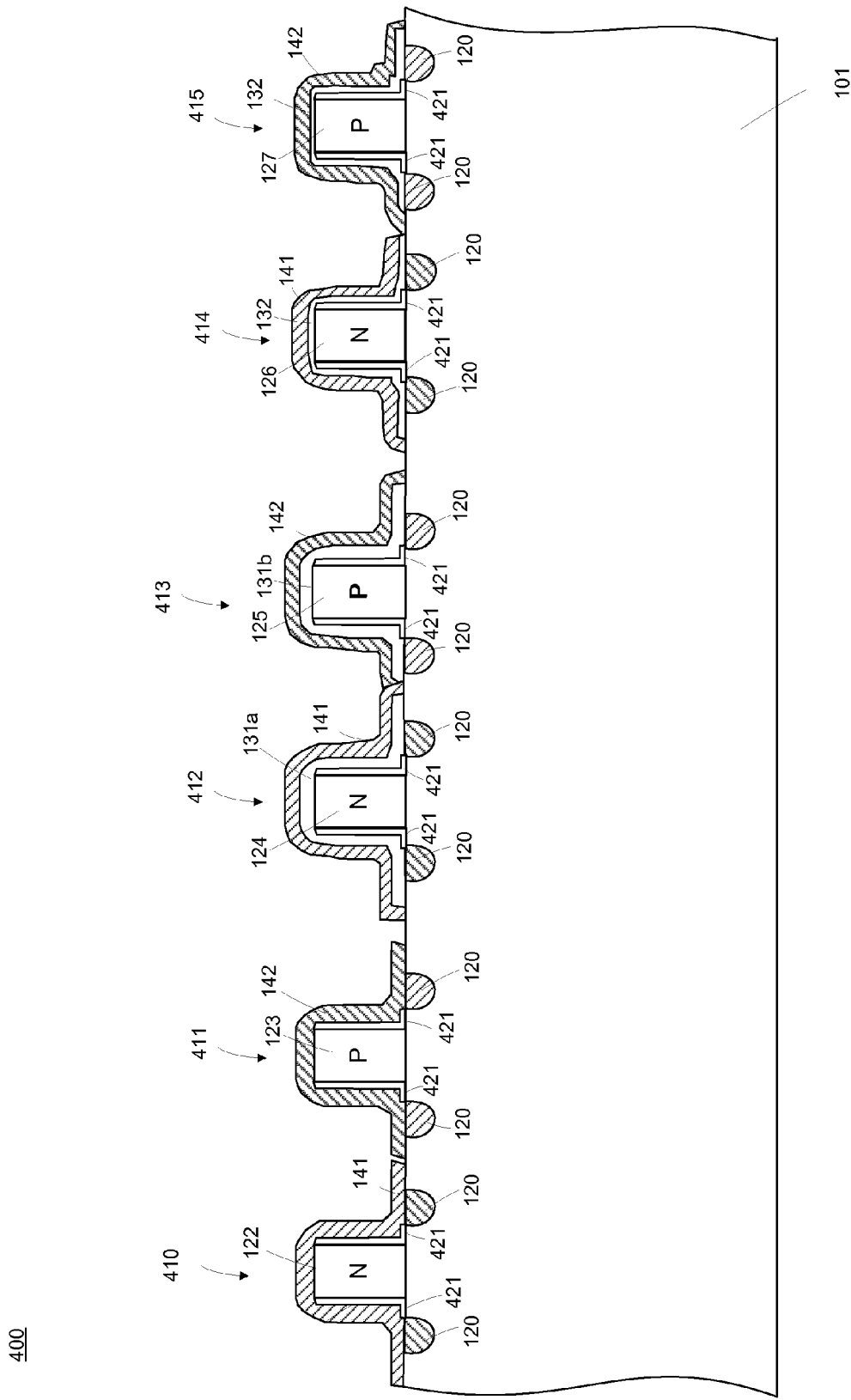
FIG. 4 shows a cross sectional view of an integrated circuit device that includes DSL MOS devices formed using the stress proximity technique, reduced-stress DSL NMOS devices and reduced-stress DSL PMOS devices in accordance with an embodiment of the present invention.

FIG. 4 shows an exemplary integrated circuit device 400 that includes devices 410-415 formed using a stress proximity technique. More particularly, instead of using a conventional spacer 121 an L-shaped spacer 421 is used, increasing the stress in the channels of each of devices 410-415. In one embodiment cells 352-357 define integrated circuit devices 410-415. More particularly, DSL NMOS device cell 352 defines DSL NMOS device 410, DSL PMOS device cell 353 defines DSL PMOS device 411, reduced-stress DSL NMOS device cell 354 defines reduced-stress DSL NMOS device 412, reduced stress DSL PMOS device cell 355 defines reduced-stress DSL PMOS device 413, reduced stress DSL NMOS device cell 356 defines reduced-stress DSL NMOS device 414 and reduced stress DSL PMOS device cell 357 defines reduced-stress DSL PMOS device 415.

In one embodiment devices 410-415 are formed by forming a first set of spacers 421 on opposite sides of each gate film stack 122-127, forming a second spacer that directly adjoins each of spacers 421, performing a salicidation process to form silicide regions over source/drain regions 120, and removing the second spacer. In one embodiment, spacers are formed by depositing a first layer of material, depositing a second layer of material over the first layer and patterning both layers at the same time. When the second spacer is removed, a selective etch process is used that will preferentially etch the overlying spacer, leaving the L-shaped spacers 421 shown in FIG. 4. Stress reduction layers 131 is deposited and patterned, followed by deposition and patterning of stress reduction layer 132. Tensile stress layer 141 is then deposited and patterned, followed by the deposition and patterning of compressive stress layer 142. In one embodiment, with the exception of spacers 421, the structures of integrated circuit device 400 are formed in the same manner as disclosed in FIGS. 1A-1H.

In one embodiment devices 410-411 are formed using the processes and materials disclosed in the reference titled "Stress Proximity Technique for Performance Improvement with Dual Stress Liner at 45 nm Technology and Beyond," X. Chen et al., 2006 *Symposium on VLSI Technology Digest of Technical Papers*, which is incorporated by reference herein in its entirety. In this embodiment, devices 412-415 are formed in the same manner as devices 410-411 except that they include stress reduction regions 131a-132b.

The use of a L-shaped spacer 421 results in more stress being imparted to the channel of each device 410-415. Accordingly, each device 410-415 will have a higher stress level and higher performance characteristics than a corresponding device 110-115. In one specific embodiment cells 352-357 define the process for forming integrated circuit device 400 of FIG. 4, where DSL NMOS device cell 352 defines DSL NMOS device 410, DSL PMOS device cell 353 defines DSL PMOS device 411, reduced-stress DSL NMOS device cell 354 defines reduced-stress DSL NMOS device 412, reduced stress DSL PMOS device cell 355 defines reduced-stress DSL PMOS device 413, reduced stress DSL NMOS device cell 356 defines reduced-stress DSL NMOS device 414 and reduced stress DSL PMOS device cell 357 defines reduced-stress DSL PMOS device 415.

By using a stress reduction layer having different thicknesses and different materials (e.g., different nitride concentrations), cells 302-361 provide a broad range of performance characteristics that can be used to form integrated circuit device designs.

In one exemplary embodiment dual stress liner NMOS cell 302 has a first stress level $S_1$, an on-current $Ion_1$ an off-current $Ioff_1$ and a first saturation current $Isat_1$. Reduced-stress dual stress liner NMOS cell 304 has a second stress level $S_2$ that is less than $S_1$, a second an on-current $Ion_2$ that is less than $Ion_1$ a second off-current $Ioff_2$ that is less than $Ion_1$ and a second saturation current $Isat_2$ that is less than $Isat_1$. Reduced-stress dual stress liner NMOS cell 306 has a third stress level $S_3$, a third on-current $Ion_3$ that is less than $Ion_1$ and a third off-current $Ioff_3$ that is greater than $Ioff_1$, where $S_3$ is less than $S_1$ and more than $S_2$, $Ion_3$ is less than $Ion_1$ but more than $Ion_2$, and $Ioff_3$ is less than $Ioff_1$ but more than $Ioff_2$. Reduced-stress dual stress liner NMOS cell 308 has a stress level $S_4$, that is less than $S_2$ an on-current $Ion_4$ that is less than $Ion_2$ and an off-current $Ioff_4$ that is greater than $Ioff_2$. Reduced-stress dual stress liner NMOS cell 310 has a stress level $S_5$, that is less than $S_2$ an on-current $Ion_4$ that is less than $Ion_2$ and an off-current $Ioff_4$ that is greater than $Ioff_2$.

Similarly, each PMOS cell 303, 305 and 307 will have a different stress level, a different Isat, Ion and Ioff as compared to the other PMOS cells. For example, in one embodiment dual stress liner PMOS cell 303 has a stress level $S_{11}$, an on-current $Ion_{11}$ an off-current $Ioff_{11}$ and a first saturation current $Isat_{11}$. Reduced-stress dual stress liner PMOS cell 305 has a second stress level $S_{12}$ that is less than $S_{11}$, a second an on-current $Ion_{12}$ that is less than $Ion_{11}$ a second off-current $Ioff_{12}$ that is less than $Ion_{11}$ and a second saturation current $Isat_{12}$ that is less than $Isat_{11}$. Reduced-stress dual stress liner PMOS cell 307 has a third stress level $S_{13}$, a third on-current $Ion_{13}$ that is less than $Ion_{11}$ and a third off-current $Ioff_{13}$ that is greater than $Ioff_{11}$, where $S_{13}$ is less than $S_{11}$ and more than $S_{12}$, $Ion_{13}$ is less than $Ion_{11}$ but more than $Ion_{12}$, and $Ioff_{13}$ is less than $Ioff_{11}$ but more than $Ioff_{12}$. Reduced-stress dual stress liner PMOS cell 309 has a stress level $S_{14}$, that is less than $S_{12}$ an on-current $Ion_{14}$ that is less than $Ion_{12}$ and an off-current $Ioff_{14}$ that is greater than $Ioff_{12}$. Reduced-stress dual stress liner PMOS cell 311 has a stress level $S_{15}$, that is less than $S_{12}$ an on-current $Ion_{14}$ that is less than $Ion_{12}$ and an off-current $Ioff_{14}$ that is greater than $Ioff_{12}$.

Figure 5:
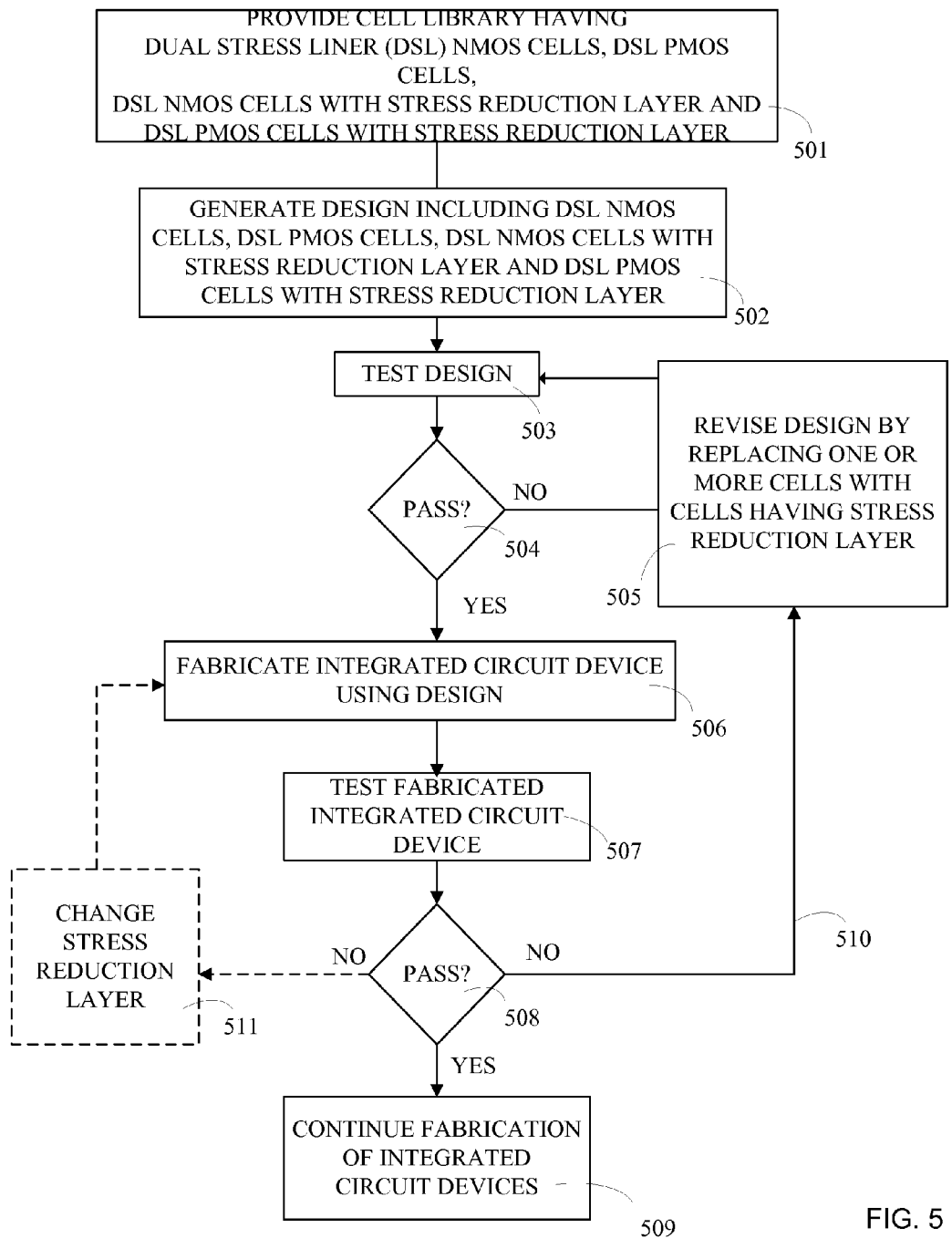
FIG. 5 is a diagram that illustrates a method for forming an integrated circuit device in accordance with an embodiment of the present invention.

FIG. 5 shows a method 500 for forming an integrated circuit device in accordance with an embodiment of the present invention. As shown by step 501 a cell library is provided that includes dual stress liner NMOS cells, dual stress liner PMOS cells, DSL NMOS cells having a stress reduction layer and DSL PMOS cells having a stress reduction layer. An integrated circuit design is generated as shown by step 502. In the present embodiment the integrated circuit design is generated by combining cells in cell library 300 so as to generate an initial integrated circuit design. This may be done on a computer using a layout editor to place cells in cell library 300 so as to generate the integrated circuit design layout.

In one embodiment step 502 generates an original integrated circuit device layout that defines a FPGA. In this embodiment columns 921-929 and/or programmable logic blocks 901-910 and 933 are selected and are laid out using a layout editor.

The design is tested as shown by step 503. If the design passes the testing of step 503, the design is used to fabricate integrated circuit device as shown by step 506. In one embodiment the test(s) of step 503 are conventional design tests such as timing tests.

If the design does not pass the testing of step 503, the integrated circuit design is revised as shown by steps 504-505 by replacing some of the NMOS cells and PMOS cells in the design with reduced-stress NMOS cells and reduced-stress PMOS cells having desired performance characteristics.

In one exemplary embodiment in which an integrated circuit design generated in step 502 includes a DSL NMOS cell 302, the design can be revised by replacing DSL NMOS cell 302 with a reduced-stress DSL NMOS cell 304, 306, 308 or 310 having the required performance characteristics. Also, DSL PMOS cells 303 in the design can be replaced by reduced-stress DSL PMOS cells 305, 307, 309 or 311 having the required performance characteristics. Reduced-stress DSL NMOS cells and reduced-stress PMOS cells can be replaced by other reduced-stress DSL NMOS cells and DSL PMOS cells that have the required performance characteristics. The process of steps 503-505 is continued until an integrated circuit device design is obtained that passes the testing of step 504. This design will include DSL NMOS cells having a stress reduction layer and DSL PMOS cells having a stress reduction layer.

Referring now to step 506, an integrated circuit device is fabricated using the integrated circuit design that passed the testing of step 503. The fabricated integrated circuit device is tested as shown by step 507. This test can be performed using probe pads to measure the electrical characteristics of the fabricated integrated circuit device.

If the integrated circuit device passes the testing of step 507, production is initiated to fabricate integrated circuit devices as shown by step 509. As shown by line 510, if the tested integrated circuit device does not pass the testing of step 507, the integrated circuit design is revised by replacing some of the NMOS cells and PMOS cells in the design with reduced-stress NMOS cells and reduced-stress PMOS cells having desired performance characteristics. Alternatively, the fabrication process is revised by changing the stress reduction layer as shown by step 511. More particularly, the thickness of the stress reduction layer or the material properties of the stress reduction layer (e.g., by increasing the nitride concentration or using a different material) is changed to obtain reduced-stress NMOS devices and reduced-stress PMOS devices having the desired performance characteristics. Also, the size and/or the shape of the stress reduction layer can be changed to obtain reduced-stress NMOS devices and reduced-stress PMOS devices having the desired performance characteristics.

In one exemplary embodiment, step 511 is performed by altering the thickness T2 of stress reduction layer 132 while maintaining the thickness T1 of stress reduction layer 131. For example, the thickness T2 can be decreased to increase the stress on reduced-stress DSL NMOS device 114 and reduced-stress DSL PMOS device 115. Alternatively, the height H and/or width W of stress reduction regions 132a and/or 132b can be decreased to increase the stress on reduced-stress DSL NMOS device 114 and reduced-stress DSL PMOS device 115. Moreover, the shape of stress reduction regions 132a and/or 132b can be changed to increase or decrease the stress on reduced-stress DSL NMOS device 114 and reduced-stress DSL PMOS device 115. Also, the nitride concentration of stress reduction region 132 can be reduced to increase the stress on reduced-stress DSL NMOS device 114 and reduced-stress DSL PMOS device 115.

After the fabrication process is changed in step 511 the process of steps 506-508 is repeated until a fabricated integrated circuit device is obtained that passes the test of step 107. When the integrated circuit device design is revised as shown by line 510, the process is of steps 503-511 is continued until an integrated circuit device is fabricated that meets both the testing requirements of steps 503 and step 507.

In one embodiment the apparatus and methods of the present invention are used to generate an original integrated circuit device layout that defines a FPGA. In this embodiment some of cells 302-399 are selected and are laid out using a layout editor. This produces a FPGA integrated circuit device having some or all of the features of architecture 200 of FIG. 2.

The methods and apparatus of the present invention provide reduced-stress dual stress liner NMOS and PMOS devices having stress reduction layers with different thickness and/or different material properties. Thereby, NMOS devices and PMOS devices are provided that have stress levels and performance levels that are higher than non-stressed NMOS and PMOS devices, but less than the stress levels and performance levels of devices formed by conventional dual stress layer processes.

Although the invention has been described with reference to particular embodiments thereof, it will be apparent to one of ordinary skill in the art that modifications to the described embodiment may be made without departing from the spirit of the invention. Accordingly, the scope of the invention will be defined by the attached claims not by the above detailed description.

What is claimed is:

1. A method for forming an integrated circuit device comprising:
   generating an integrated circuit device design that includes a dual stress liner NMOS cell, a dual stress liner PMOS cell, a reduced-stress dual stress liner NMOS cell and a reduced-stress dual stress liner PMOS cell; and
   fabricating an integrated circuit device using the integrated circuit device design so as to form an integrated circuit device having a dual stress liner NMOS device that includes a tensile stress layer that overlies a first NMOS gate film stack, a dual stress liner PMOS device that includes a compressive stress layer that overlies a first PMOS gate film stack, a reduced-stress dual stress liner NMOS device having a first stress reduction layer that extends between the tensile stress layer and a second NMOS gate film stack, and a reduced-stress dual stress liner PMOS device that includes a second PMOS gate film stack, the first stress reduction layer extending between the compressive stress layer and the second PMOS gate film stack.

2. The method of claim 1 further comprising providing a cell library that includes the dual stress liner NMOS cell, the dual stress liner PMOS cell, the reduced-stress dual stress liner NMOS cell and the reduced-stress dual stress liner PMOS cell.

3. The method of claim 2 wherein the cell library further comprises additional reduced-stress dual stress liner NMOS cells for forming additional reduced-stress dual stress liner NMOS devices and additional reduced-stress dual stress liner PMOS cells for forming additional reduced-stress dual stress liner PMOS devices, some of the additional reduced-stress dual stress liner NMOS devices and some of the additional reduced-stress dual stress liner PMOS devices having a third stress reduction layer with a nitride concentration that is different from the nitride concentration of the first stress reduction layer.

4. The method of claim 1 wherein the cell library further comprises additional reduced-stress dual stress liner NMOS cells for forming additional reduced-stress dual stress liner NMOS devices and additional reduced-stress dual stress liner PMOS cells for forming additional reduced-stress dual stress liner PMOS devices, some of the additional reduced-stress dual stress liner NMOS devices and some of the additional reduced-stress dual stress liner PMOS devices having a second stress reduction layer with a thickness that is different from the thickness of the first stress reduction layer.

5. The method of claim 4 further comprising testing the fabricated integrated circuit device and, if the integrated circuit device does not pass the test, changing a thickness of a stress reduction layer of one or more of the additional reduced-stress dual stress liner NMOS cells and one or more of the additional reduced-stress dual stress liner PMOS cells.

6. The method of claim 4 further comprising testing the fabricated integrated circuit device and, if the integrated circuit device does not pass the test, changing a nitride concentration of a stress reduction layer of one or more of the additional reduced-stress dual stress liner NMOS cells and one or more of the additional reduced-stress dual stress liner PMOS cells.

7. The method of claim 1 further comprising testing the integrated circuit device design and, if the integrated circuit device design does not pass the test, generating a revised integrated circuit device design by replacing at least some of the dual stress liner NMOS cells in the integrated circuit device design with reduced-stress dual stress liner NMOS cells and replacing at least some of the dual stress liner PMOS cells with the reduced-stress dual stress liner PMOS cells.

8. A method for forming an integrated circuit device comprising:
   generating an initial integrated circuit device design;
   forming a plurality of dual stress liner NMOS devices that include a tensile stress layer that overlies a first NMOS gate film stack;
   forming a plurality of dual stress liner PMOS devices that include a compressive stress layer that overlies a first PMOS gate film stack;
   testing the initial integrated circuit device design;
   revising the initial integrated circuit design if the initial integrated circuit design does not pass the testing;
   forming a reduced-stress dual stress liner NMOS device having a first stress reduction layer that extends between the tensile stress layer and a second NMOS gate film stack; and
   forming a reduced-stress dual stress liner PMOS device that includes a second PMOS gate film stack, the first stress reduction layer extending between the compressive stress layer and the second PMOS gate film stack.

9. The method of claim 8 further comprising:
   prior to forming the NMOS devices and the PMOS devices, providing a cell library that includes a dual stress liner NMOS cell, a dual stress liner PMOS cell, a reduced-stress dual stress liner NMOS cell, and a reduced-stress dual stress liner PMOS cell;
   prior to forming the NMOS devices and the PMOS devices, generating an integrated circuit device design that includes the dual stress liner NMOS cell, the dual stress liner PMOS cell, the reduced-stress dual stress liner NMOS cell and the reduced-stress dual stress liner PMOS cell;
   generating additional reduced-stress dual stress liner NMOS cells for forming additional reduced-stress dual stress liner NMOS devices; and
   generating additional reduced-stress dual stress liner PMOS cells for forming additional reduced-stress dual stress liner PMOS devices,
   wherein some of the additional reduced-stress dual stress liner NMOS devices and some of the additional reduced-stress dual stress liner PMOS devices include a second stress reduction layer with a thickness that is different from the thickness of the first stress reduction layer.

10. The method of claim 9 further comprising testing a fabricated integrated circuit device and, if the integrated circuit device does not pass the test, changing a thickness of the second stress reduction layer of one or more of the additional reduced-stress dual stress liner NMOS cells and one or more of the additional reduced-stress dual stress liner PMOS cells.

11. The method of claim 9 further comprising testing the fabricated integrated circuit device and, if the integrated circuit device does not pass the test, changing a nitride concentration of the second stress reduction layer of one or more of the additional reduced-stress dual stress liner NMOS cells and one or more of the additional reduced-stress dual stress liner PMOS cells.

12. The method of claim 8 further comprising:
   prior to forming the NMOS devices and the PMOS devices, providing a cell library that includes a dual stress liner NMOS cell, a dual stress liner PMOS cell, a reduced-stress dual stress liner NMOS cell and a reduced-stress dual stress liner PMOS cell; and
   prior to forming the NMOS devices and the PMOS devices, generating an integrated circuit device design that includes the dual stress liner NMOS cell, the dual stress liner PMOS cell, the reduced-stress dual stress liner NMOS cell and the reduced-stress dual stress liner PMOS cell;
   wherein revising the initial integrated circuit device design comprises generating a revised integrated circuit device design by replacing at least some of the dual stress liner NMOS cells in the integrated circuit device design with reduced-stress dual stress liner NMOS cells and replacing at least some of the dual stress liner PMOS cells with the reduced-stress dual stress liner PMOS cells.

13. The method of claim 8 further comprising:
   prior to forming the NMOS devices and the PMOS devices, providing a cell library that includes a dual stress liner NMOS cell, a dual stress liner PMOS cell, a reduced-stress dual stress liner NMOS cell and a reduced-stress dual stress liner PMOS cell;
   prior to forming the NMOS devices and the PMOS devices, generating an integrated circuit device design that includes a plurality of the dual stress liner NMOS cells, the dual stress liner PMOS cells, a plurality of the reduced-stress dual stress liner NMOS cells and a plurality of the reduced-stress dual stress liner PMOS cells; and
   generating additional reduced-stress dual stress liner NMOS cells for forming additional reduced-stress dual stress liner NMOS devices;
   generating additional reduced-stress dual stress liner PMOS cells for forming additional reduced-stress dual stress liner PMOS devices,
   wherein some of the additional reduced-stress dual stress liner NMOS devices and some of the additional reduced-stress dual stress liner PMOS devices have a third stress reduction layer with a nitride concentration that is different from the nitride concentration of the first stress reduction layer.

14. An integrated circuit device comprising:
   a dual stress liner NMOS device that includes a tensile stress layer that overlies a first NMOS gate film stack;

a dual stress liner PMOS device that includes a compressive stress layer that overlies a first PMOS gate film stack;

a reduced-stress dual stress liner NMOS device having a stress reduction layer that extends between the tensile stress layer and a second NMOS gate film stack; and a reduced-stress dual stress liner PMOS device, the stress reduction layer extending between the compressive stress layer and a second PMOS gate film stack;

wherein the reduced-stress dual stress liner NMOS device and the reduced-stress dual stress liner PMOS device are implemented if an initial integrated circuit device design does not pass testing.

15. The integrated circuit device of claim 14 wherein the dual stress liner NMOS device has a first stress level, the reduced-stress dual stress liner NMOS device has a second stress level that is less than the first stress level, the dual stress liner PMOS device has a third stress level and the reduced-stress dual stress liner PMOS device has a fourth stress level that is less than the third stress level.

16. The integrated circuit device of claim 15 further comprising an additional reduced-stress dual stress liner NMOS device having a fifth stress level that is less than the second stress level and an additional reduced-stress dual stress liner PMOS device having a sixth stress level that is less than the fourth stress level.

17. The integrated circuit device of claim 14 wherein the stress reduction layer has a first thickness, and further comprising an additional stress reduction layer having a thickness that is less than the first thickness, the additional stress reduction layer extending between a third NMOS gate film stack of the additional reduced-stress dual stress liner NMOS device and the tensile stress layer, and extending between a third PMOS gate film stack of the additional reduced-stress dual stress liner PMOS device and the compressive stress layer.

18. The integrated circuit device of claim 14 wherein the stress reduction layer comprises a layer of nitride having a first nitride concentration and a first thickness, and further comprising an additional stress reduction layer having a thickness that is approximately the same as the first thickness and having a nitride concentration that is less than the first nitride concentration, the additional stress reduction layer extending between a third NMOS gate film stack of an additional reduced-stress dual stress liner NMOS device and the tensile stress layer, and extending between a third PMOS gate film stack of an additional reduced-stress dual stress liner PMOS device and the compressive stress layer.

19. The integrated circuit device of claim 14 wherein the integrated circuit device is fabricated from an integrated circuit device design that includes a dual stress liner NMOS cell, a dual stress liner PMOS cell, a reduced-stress dual stress liner NMOS cell and a reduced-stress dual stress liner PMOS cell.

20. The integrated circuit device of claim 19 wherein a cell library includes the dual stress liner NMOS cell, the dual stress liner PMOS cell, the reduced-stress dual stress liner NMOS cell and the reduced-stress dual stress liner PMOS cell.

* * * * *